United States Patent
Clegg

(10) Patent No.: US 8,624,583 B2
(45) Date of Patent: Jan. 7, 2014

(54) MEASURING ALTERNATING CURRENT FLOWING THROUGH AN ELECTRICITY SUPPLY DISTRIBUTION UNIT

(75) Inventor: Andrew Simon Clegg, Cirencester (GB)

(73) Assignee: Ecoauditors Limited, Jarrow (GB)

(*) Notice: Subject to any disclaimer, the term of this patent is extended or adjusted under 35 U.S.C. 154(b) by 541 days.

(21) Appl. No.: 12/742,762

(22) PCT Filed: Nov. 21, 2008

(86) PCT No.: PCT/GB2008/051097
§ 371 (c)(1),
(2), (4) Date: Aug. 16, 2010

(87) PCT Pub. No.: WO2009/071931
PCT Pub. Date: Jun. 11, 2009

(65) Prior Publication Data
US 2010/0308800 A1  Dec. 9, 2010

Related U.S. Application Data

(60) Provisional application No. 60/992,116, filed on Dec. 4, 2007.

(30) Foreign Application Priority Data

Dec. 4, 2007 (GB) .................................. 0723621.9

(51) Int. Cl.
*G01R 19/00* (2006.01)
(52) U.S. Cl.
USPC .... 324/156; 324/127; 324/117 H; 324/76.11; 702/62; 340/646

(58) Field of Classification Search
USPC .............................................. 324/117 H, 157
See application file for complete search history.

(56) References Cited

U.S. PATENT DOCUMENTS

| | | | |
|---|---|---|---|
| 6,545,456 B1 * | 4/2003 | Radosevich et al. ...... | 324/117 H |
| 6,708,126 B2 * | 3/2004 | Culler et al. .................... | 702/64 |
| 6,737,854 B2 * | 5/2004 | Bruno et al. .............. | 324/117 R |
| 6,937,003 B2 * | 8/2005 | Bowman et al. .......... | 324/117 R |
| 6,957,158 B1 | 10/2005 | Hancock et al. | |
| 2003/0178986 A1 | 9/2003 | Bruno et al. | |

(Continued)

FOREIGN PATENT DOCUMENTS

| WO | WO-96/28378 A1 | 9/1996 |
|---|---|---|
| WO | WO-96/28738 A1 | 9/1996 |
| WO | WO 2006010865 A1 * | 2/2006 |

OTHER PUBLICATIONS

Meggyesi, Zoltán, "International Search Report", for PCT/GB2008/051097 as mailed Mar. 19, 2009, 5 pages.

*Primary Examiner* — Jermele M Hollington
*Assistant Examiner* — Adam Clarke
(74) *Attorney, Agent, or Firm* — Winstead PC

(57) ABSTRACT

An apparatus (100) adapted to measure Alternating Current flowing through an electricity supply distribution unit (204) having a plurality of distribution cables (202). The apparatus (100) includes a plurality of current measuring devices (102), each of the current measuring devices (102), in use, measuring current flowing through one of the distribution cables (202), at least some of the current measuring devices (102) being mounted on a rigid/semi-rigid body (104), and a device configured to store and/or transfer information representing current measured by at least one of the current measuring devices (102).

15 Claims, 4 Drawing Sheets

(56) References Cited

U.S. PATENT DOCUMENTS

| | | |
|---|---|---|
| 2005/0073293 A1 | 4/2005 | Hastings et al. |
| 2005/0101193 A1* | 5/2005 | Godard ......................... 439/652 |
| 2005/0212526 A1* | 9/2005 | Blades ......................... 324/543 |
| 2006/0255793 A1* | 11/2006 | Montreuil ................. 324/117 R |
| 2006/0274481 A1 | 12/2006 | Nelson et al. |
| 2008/0203826 A1* | 8/2008 | Chung ......................... 307/131 |
| 2012/0200285 A1* | 8/2012 | Carpenter et al. ............ 324/157 |
| 2012/0249336 A1* | 10/2012 | Moell et al. ................... 340/646 |

* cited by examiner

MEASURING ALTERNATING CURRENT FLOWING THROUGH AN ELECTRICITY SUPPLY DISTRIBUTION UNIT

CROSS-REFERENCE TO RELATED APPLICATIONS

This patent application claims priority from, and incorporates by reference the entire disclosure of, U.S. Provisional Patent Application No. 60/992,116, filed on Dec. 4, 2007.

The present invention relates to measuring alternating current flowing through an electricity supply distribution unit.

Increasing fuel prices and concern about the effects of energy usage on the environment have led to a greater awareness of the amount of energy used by domestic and business premises. Embodiments of the present invention are intended to provide means for conveniently measuring consumption electricity.

According to one aspect of the present invention there is provided apparatus adapted to measure Alternating Current flowing through an electricity supply distribution unit having a plurality of distribution cables, the apparatus including:

a plurality of current measuring devices, each of the current measuring devices, in use, measuring current flowing through one of the distribution cables, at least some of the current measuring devices being mounted on a rigid/semi-rigid body, and a device configured to store and/or transfer information representing current measured by at least one of the current measuring devices.

The current measuring devices may include devices configured to measure magnetic flux in the distribution cables. In one embodiment the current measuring device includes a ferrite core fitted with a Hall Effect device. The ferrite core may have an open loop-shape (e.g. a broken circle or C-shape) with a gap in which the Hall Effect device is fitted. The gap in the ferrite core may be about 1.6 mm.

The rigid/semi-rigid body may be an elongate member. The current measuring devices may be mounted on the elongate member in an arrangement that substantially corresponds to an arrangement of the distribution cables extending from the distribution unit. The rigid/semi-rigid body may comprise a Printed Circuit Board including circuitry associated with the current measuring devices. The rigid/semi-rigid body may be at least partially sealed within a protective covering, e.g. epoxy resin. A protective housing may be provided for the apparatus.

The apparatus may include an analogue to digital converter (ADC) for converting signals produced by the current measuring devices into digital signals containing information representing magnitudes of the measured currents. The apparatus may include a communications device for transferring the measured current information to a remote device. The remote device may comprise a computing device arranged to analyse and/or display the measured current information. The communications device may be a wireless communications device. The apparatus may include a storage device configured to store calibration data. The calibration data may comprise output information recorded for each sensor during initial tests performed with various reference currents.

According to another aspect of the present invention there is provided a method of measuring Alternating Current flowing through an electricity supply distribution unit having a plurality of distribution cables, the method including fitting apparatus substantially as described herein to the distribution cables of the electricity supply distribution unit.

Whilst the invention has been described above, it extends to any inventive combination of features set out above or in the following description. Although illustrative embodiments of the invention are described in detail herein with reference to the accompanying drawings, it is to be understood that the invention is not limited to these precise embodiments. As such, many modifications and variations will be apparent to practitioners skilled in the art. Furthermore, it is contemplated that a particular feature described either individually or as part of an embodiment can be combined with other individually described features, or parts of other embodiments, even if the other features and embodiments make no mention of the particular feature. Thus, the invention extends to such specific combinations not already described.

The invention may be performed in various ways, and, by way of example only, embodiments thereof will now be described, reference being made to the accompanying drawings in which.

Figure 1:
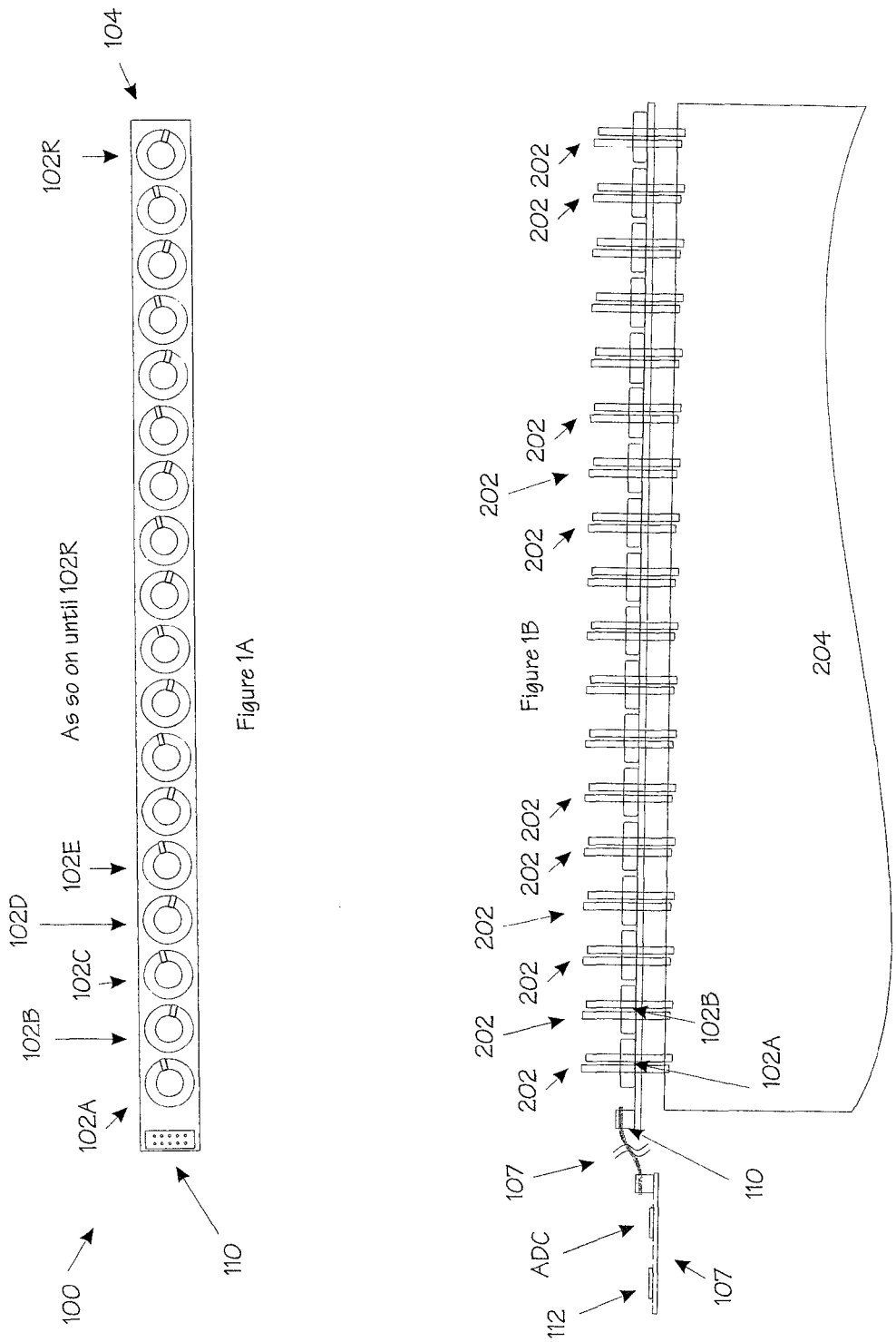
FIG. 1A is a plan view of an embodiment of the measuring apparatus.
FIG. 1B is a side view of the measuring apparatus of FIG. 1 that also shows a distribution unit.

Referring to FIGS. 1A and 1B, there is shown an example of measuring apparatus 100 fitted to a set of distribution cables 202 of an electricity supply distribution unit 204. The distribution unit can be a domestic consumer unit, an industrial distribution unit or the like. The apparatus 100 includes a set of 18 measuring devices 102A-102R. Each measuring device is fitted around one of the 18 distribution cables 202. It will be understood that the number of measuring devices will normally match the number of distribution cables, but variations to this are possible.

Each measuring device is mounted on a rigid/semi-rigid body 104. In the example the body comprises an elongate body that is rectangular in plan and has dimensions of around 334 mm×19 mm×1.5 mm. Again, it will be appreciated that the design and dimensions of the body are exemplary only and variations are possible. For instance, there could be several rigid/semi-rigid bodies connected together, each body having one or more of the measuring devices mounted thereon, or at least one of the devices may not be mounted on a body. The measuring devices are arranged in 9 pairs in a straight line so as to surround 18 corresponding apertures 108 in the body. The arrangement of the apertures/measuring devices is designed to correspond with the arrangement of the distribution cables 202 extending from the unit 204 and so it will be understood that the arrangement can be varied if necessary, e.g. a 3×3 grid-like formation to match a 3×3 grid-like arrangement of cables.

In the example, the body 104 comprises a printed circuit board (formed of any suitable material, such as Polychlorinated biphenyl, so that it can be rigid or semi-rigid as required) containing circuitry associated with the measuring devices, but it will be understood that in other embodiments the body that is separate from any circuitry (which can allow the circuitry to be formed of rigid, semi-rigid or flexible components). The measuring devices can be fixed to the PCB by any suitable means, e.g. glue. The PCB can include holes for circuit wires at 18 mm intervals to match the 18 mm pitch of a British Standard Miniature Circuit Breaker. The apparatus may be provided with a protective covering, e.g. epoxy resin, and/or may be fitted inside a protective housing, e.g. a rigid box.

Figure 2:
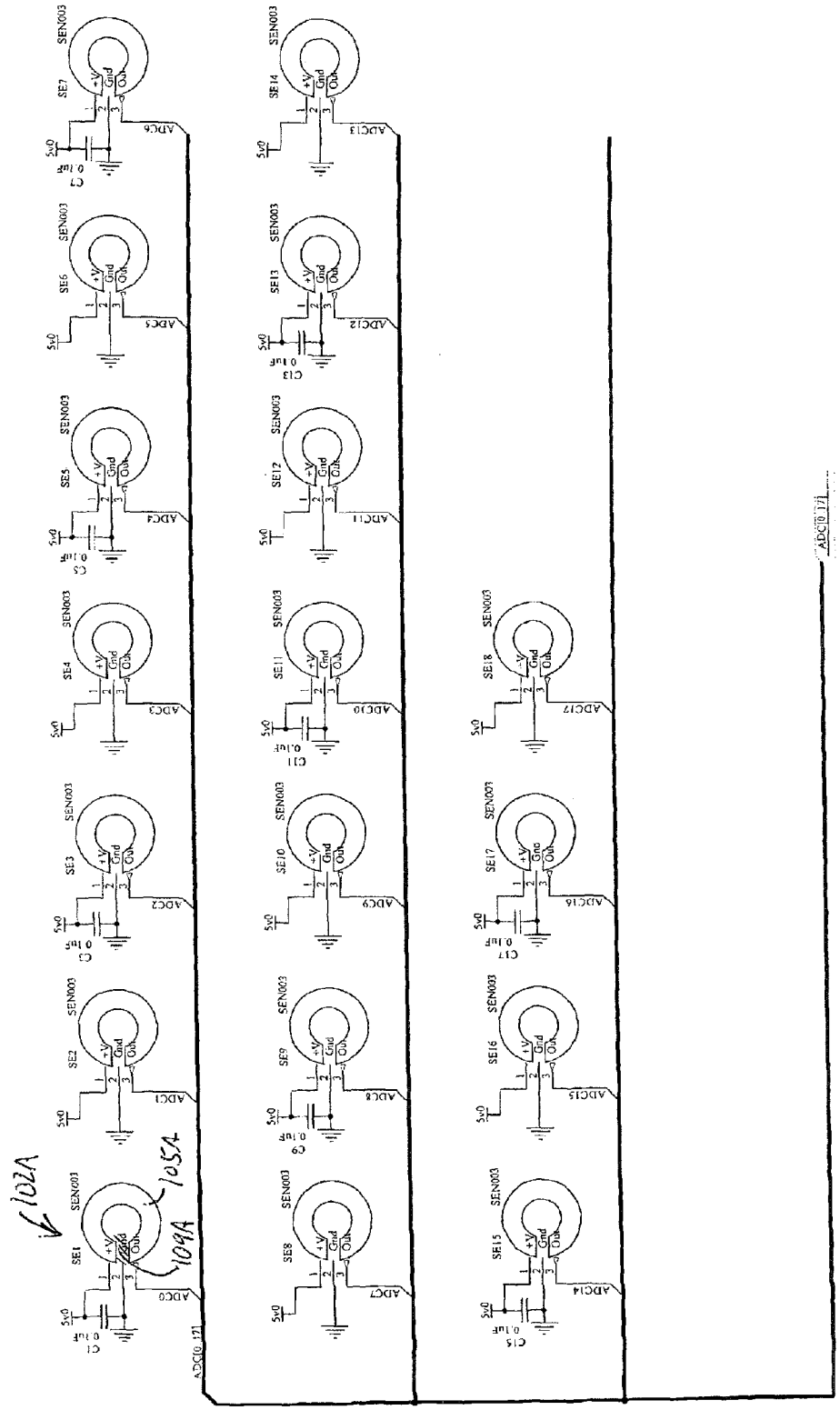
FIG. 2 is a circuit diagram showing a set of measuring devices of the measuring apparatus.
Figure 3:
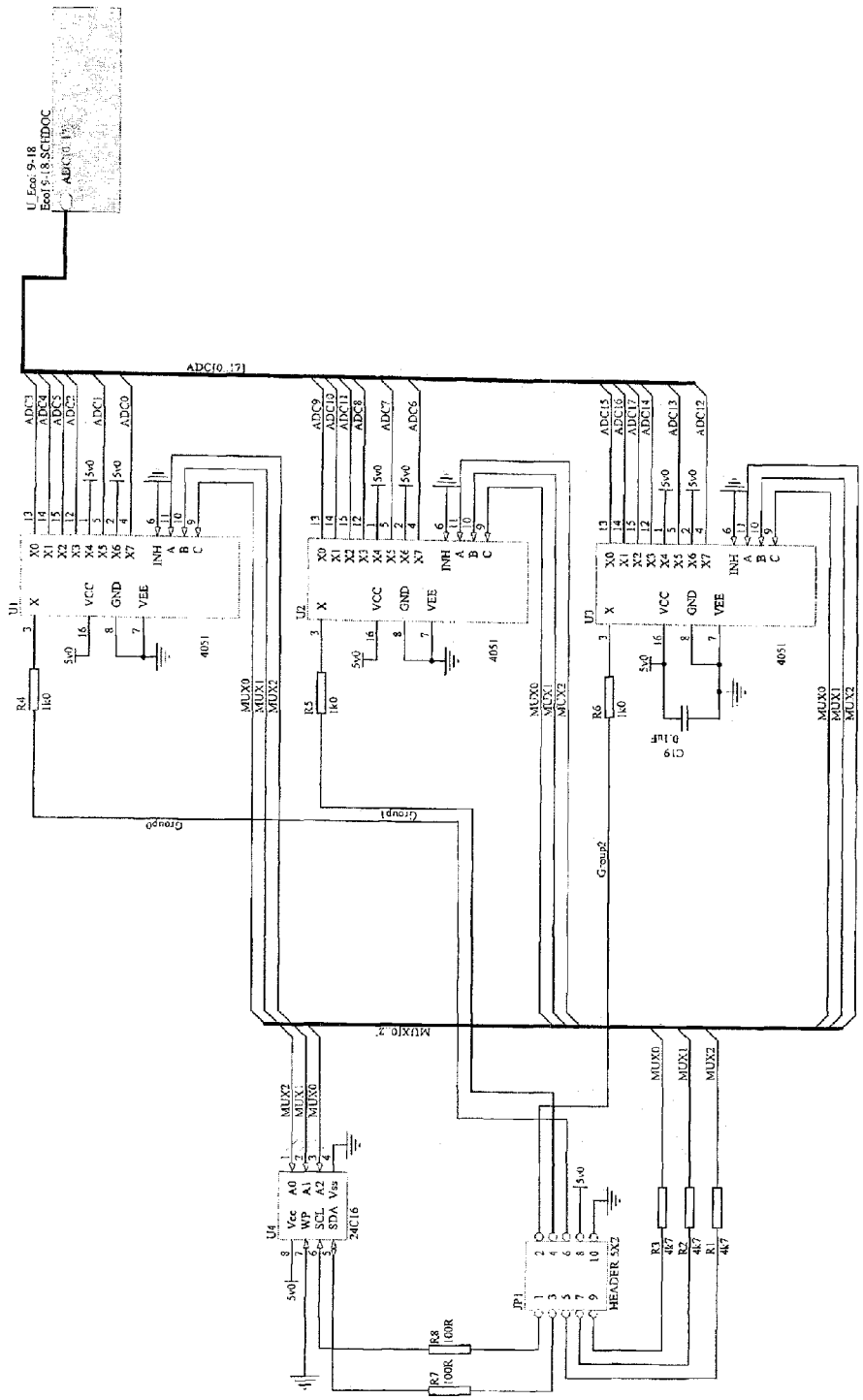
FIG. 3 is a circuit diagram showing further components of the measuring apparatus.

The construction of the measuring devices 102 can be seen schematically in the circuit diagram of FIG. 2. For brevity, one of the measuring devices 102A will be described and it will be understood that the construction of the other measuring devices can be substantially identical. The measuring device 102A includes a ferrite core 105A forming an open loop shape (a C-shape/broken circle shape in the example, although it will be appreciated that variations, such as a square shape, are possible). The gap in the ferrite core is around 16 mm.

During use, the ferrite core concentrates the magnetic flux produced by the current flowing through the distribution cable. A Hall Effect device 109A is fitted within the gap so as to direct the magnetic flux through the measuring device. The Hall Effect device converts the magnetic flux into an analogue voltage. Turning to the circuit diagram of FIG. 4, it can be seen that the circuit further comprises a set of multiplexers U1, U2, U3 that are arranged to decode the analogue signals produced by the measuring devices to an ADC, which, in the example, is located on a separate board 107 that can be connected to the PCB by means of a cable 107 plugged into a socket 110 (shown in FIGS. 1A and 1B), although it will be understood that in other embodiments the ADC may be located on the same board. Decoupling capacitors can be used to reduce power rail noise. Resistors (R1-R8) may be fitted to reduce the likelihood of CMOS latch-up.

An EEPROM device (U4, 24C16) is fitted on the PCB and is used to store calibration values. The apparatus is calibrated prior to delivery and the calibration values on the EEPROM device can be read by a conversion board (connected to JP1) upon power up, with the calibration values being used to improve accuracy of the readings. The calibration data comprises information recorded for each sensor during initial tests performed with various reference currents (e.g. 50 A, 0 A, 100 A, 150 A, −50 A, −100 A and −150 A). Additional information may also be stored, e.g. a serial number for the board, an indication of the number of sensors on the board and checksum information for confirming the data. A partial example of the format of the calibration data that may be used is given in the table below:

| Serial Address | S1 Data | Byte | Sensor | Current |
|---|---|---|---|---|
| H0000 | H41 | LSB | 0 | 50 A |
| H0001 | H61 | | | |
| H0002 | H97 | MSB | | |
| H0003 | H9B | LSB | 1 | −50 A |
| H0004 | HC6 | | | |
| H0005 | H67 | MSB | | |
| H0006 | H14 | LSB | 2 | 50 A |
| H0007 | HC4 | | | |
| H0008 | H97 | MSB | | |
| H0009 | HBE | LSB | 3 | −50 A |
| H000A | HBE | | | |
| H000B | H67 | MSB | | |
| H000C | H38 | LSB | 4 | 50 A |
| H000D | HE5 | | | |
| H000E | H95 | MSB | | |
| H000F | H85 | LSB | 5 | −50 A |
| H0010 | HCE | | | |
| H0011 | H69 | MSB | | |
| H0012 | H14 | LSB | 6 | 50 A |
| H0013 | H51 | | | |
| H0014 | H97 | MSB | | |
| H0015 | HD5 | LSB | 7 | −50 A |
| H0016 | H24 | | | |
| H0017 | H68 | MSB | | |
| H0018 | H36 | LSB | 8 | 50 A |
| H0019 | H8F | | | |
| H001A | H97 | MSB | | |
| H001B | H4C | LSB | 9 | −50 A |
| H001C | H1F | | | |
| H001D | H68 | MSB | | |
| H001E | H8A | LSB | 10 | 50 A |
| H001F | H36 | | | |
| H0020 | H97 | MSB | | |
| H0021 | HFD | LSB | 11 | −50 A |
| H0022 | HCF | | | |
| H0023 | H68 | MSB | | |
| H0024 | HB4 | LSB | 12 | 50 A |
| H0025 | H72 | | | |
| H0026 | H97 | MSB | | |
| H0027 | H35 | LSB | 13 | −50 A |
| H0028 | HD3 | | | |
| H0029 | H67 | MSB | | |
| H002A | H2F | LSB | 14 | 50 A |
| H002B | HF3 | | | |
| H002C | H97 | MSB | | |
| H002D | HE3 | LSB | 15 | −50 A |
| H002E | HB2 | | | |
| H002F | H67 | MSB | | |
| H0030 | H0B | LSB | 16 | 50 A |
| H0031 | HB6 | | | |
| H0032 | H96 | MSB | | |
| H0033 | H80 | LSB | 17 | −50 A |
| H0034 | H3F | | | |
| H0035 | H67 | MSB | | |
| . . . | | | | |

In the partial example, the first 54 bytes relate to the 18 sensors with a 50 A calibration current (sign changes can be provided for the even-number sensors due to the stitching of the calibration cable). There are three bytes for each sensor, i.e. a 24 bit result. The next 54 bytes will contain data relating to the 18 sensors tested with 0 A. This allows for any magnetization of the core with the 50 A flowing. The above test pattern is repeated for 100 A and 150 A, with all the results being stored in a similar format. The current can then be reversed and the testing and recording is repeated for currents of −50 A, −100 A and −150 A with respect to sensor 0. Following the test data, additional data (e.g. Board Serial Number—4 bytes—32 bits; 5V supply to Sensor boards—3 bytes—24 bits in hexadecimal—Divide by 2^21 for actual voltage; Number of Sensors on Board—1 byte in hexadecimal; and Checksum—2 bytes—Using 16 bit polynomial—Polynomial $A001) can also be stored.

Figure 4:
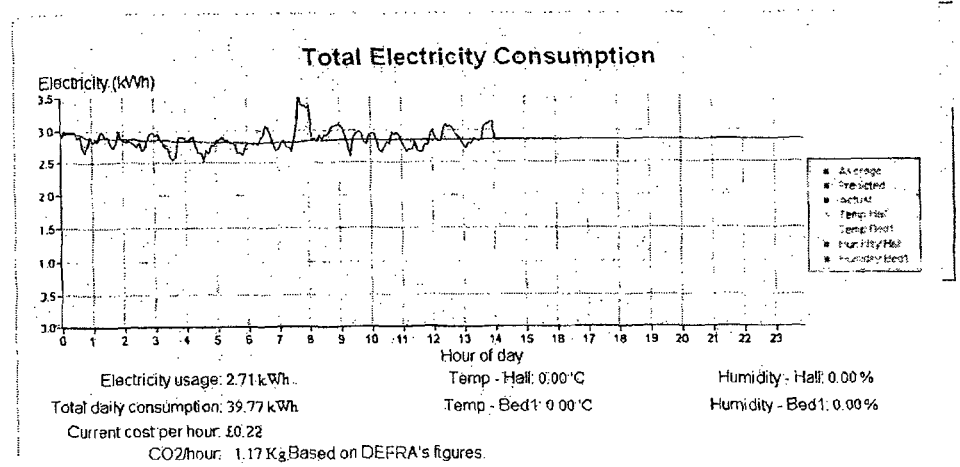
FIGS. 4 and 5 are graphs illustrating examples of representations of electricity usage data measured by the apparatus.
Figure 5:
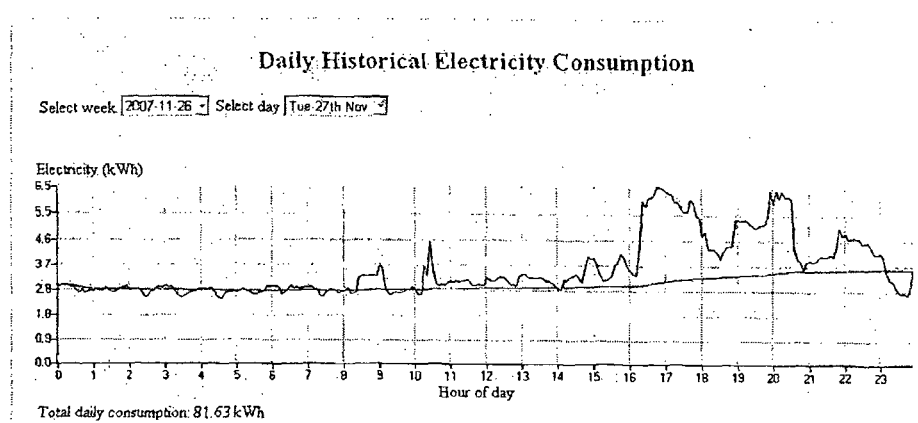

The signals output by the ADC contain information representing the magnitude of the current measured by each of the measuring devices. This data can then be stored in a local storage device and/or transferred to another device for storage/processing, e.g. by a wired or wireless communications device 112. The transferring of the data may be done at regular intervals and the data may be time/date-stamped on transmission or receipt. Data relating to individual ones of the measuring devices may be sent simultaneously or sequentially. In some embodiments the apparatus may be modified so that data relating to a set of selected ones of the measuring devices may be chosen for storage/transfer. The data may be used to produce displays, e.g. graphs showing electricity usage over a period of time as illustrated in FIGS. 4 and 5. It will be understood that many variations are possible, e.g. a local display component that shows a numerical value representing the usage.

As the measuring devices are connected to a body that is arranged to match the positions of the distribution cables extending from the distribution unit, it can be quickly and easily fitted by disconnecting the cables from the unit, slipping them through the ring-shaped measuring devices and then re-connected the cables to the unit. The body 104 will normally be sufficiently light-weight so that it can be supported by the cables, or it may be dimensioned to fit on an upper surface of the distribution box (as shown in FIG. 1B). Fixing devices may also be provided to attach the measuring apparatus to the distribution box or another surface. Having the measuring devices connected to a rigid/semi-rigid body also helps keep the apparatus in position during extended use, or if the cables are disturbed.

The invention claimed is:

1. An apparatus adapted to measure Alternating Current flowing through an electricity supply distribution unit having a plurality of distribution cables, the apparatus comprising:
   a plurality of current measuring devices, each of the plurality of current measuring devices, in use, measuring current flowing through one of the plurality of distribution cables, at least some of the plurality of current measuring devices being mounted on a rigid/semi-rigid body, and a device configured to store and/or transfer information representing current measured by at least one current measuring device of the plurality of current measuring devices;
   wherein the rigid/semi-rigid body is an elongate member;
   wherein the plurality of current measuring devices are mounted on the elongate member, such that a first current measuring device is aligned with, and does not overlap, an adjacent current measuring device, the plurality of current measuring devices being arranged in an arrangement that corresponds to an arrangement of the plurality of distribution cables extending from the electricity supply distribution unit; and
   wherein each of the current measuring devices that is mounted on the elongate member includes a ferrite core fitted with a Hall Effect device and is adapted to receive a corresponding distribution cable therethrough.

2. The apparatus according to claim 1 wherein the plurality of current measuring devices include devices configured to measure magnetic flux in the plurality of distribution cables.

3. The apparatus according to claim 1 wherein the ferrite core comprises an open loop-shape with a gap in which the Hall Effect device is fitted.

4. The apparatus according to claim 3 wherein the gap in the ferrite core is about 1.6 mm.

5. The apparatus according to claim 1 wherein the rigid/semi-rigid body comprise a Printed Circuit Board including circuitry associated with the plurality of current measuring devices.

6. The apparatus according to claim 5 wherein the rigid/semi-rigid body is at least partially sealed within a protective covering.

7. The apparatus according to claim 1 further comprising a protective housing.

8. The apparatus according to claim 1 further comprising an analog to digital converter (ADC) for converting signals produced by the plurality of current measuring devices into digital signals containing information representing magnitudes of the measured currents.

9. The apparatus according to claim 1 further comprising a communications device for transferring the measured current information to a remote device.

10. The apparatus according to claim 9 wherein the remote device comprises a computing device arranged to analyze and/or display the measured current information.

11. The apparatus according to claim 9 wherein the communications device is a wireless communications device.

12. The apparatus according to claim 1 further comprising a storage device configured to store calibration data.

13. The apparatus according to claim 12 wherein the calibration data comprises output information recorded for each sensor during initial tests performed with various reference currents.

14. A method of measuring Alternating Current flowing through an electricity supply distribution unit having a plurality of distribution cables, the method including fitting an apparatus according to claim 1 to the plurality of distribution cables of the electricity supply distribution unit.

15. The apparatus according to claim 1, wherein the plurality of current measuring devices are mounted on the elongate member such that each current measuring device of the plurality of current measuring devices is aligned with an adjacent current measuring device.

* * * * *

UNITED STATES PATENT AND TRADEMARK OFFICE
CERTIFICATE OF CORRECTION

PATENT NO.       : 8,624,583 B2                                Page 1 of 1
APPLICATION NO. : 12/742762
DATED            : January 7, 2014
INVENTOR(S)      : Andrew Simon Clegg It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 615 days.

Signed and Sealed this
Twenty-second Day of September, 2015

Michelle K. Lee
*Director of the United States Patent and Trademark Office*